United States Patent
Fukuda

(10) Patent No.: US 10,218,352 B2
(45) Date of Patent: Feb. 26, 2019

(54) SEMICONDUCTOR INTEGRATED CIRCUIT

(71) Applicant: KABUSHIKI KAISHA TOSHIBA, Tokyo (JP)

(72) Inventor: Shohei Fukuda, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 43 days.

(21) Appl. No.: 15/250,857

(22) Filed: Aug. 29, 2016

(65) Prior Publication Data
US 2017/0264290 A1    Sep. 14, 2017

(30) Foreign Application Priority Data

Mar. 14, 2016  (JP) ................................. 2016-050093

(51) Int. Cl.
*H03K 17/687* (2006.01)
*H03K 19/003* (2006.01)
*H03K 19/0175* (2006.01)

(52) U.S. Cl.
CPC ................ *H03K 17/6872* (2013.01)

(58) Field of Classification Search
CPC ......... H03K 17/6872; H03K 19/00315; H03K 19/0175
See application file for complete search history.

(56) References Cited

U.S. PATENT DOCUMENTS

| 5,831,449 | A | 11/1998 | Shigehara et al. |
| 6,018,257 | A * | 1/2000 | Hung ............... H03K 19/00315 326/58 |
| 6,040,712 | A | 3/2000 | Mejia |
| 7,429,873 | B2 * | 9/2008 | Peschke ............... H03K 17/102 326/81 |
| 7,746,124 | B2 * | 6/2010 | Ajit ......................... G11C 5/14 326/82 |
| 2009/0150589 | A1 | 6/2009 | Watarai et al. |

FOREIGN PATENT DOCUMENTS

| JP | 4254895 B1 | 4/2009 |
| JP | 4258569 B1 | 4/2009 |
| JP | 4551517 B2 | 9/2010 |
| JP | 4577527 B2 | 11/2010 |

* cited by examiner

*Primary Examiner* — Lincoln Donovan
*Assistant Examiner* — Colleen O Toole
(74) *Attorney, Agent, or Firm* — Kim & Stewart LLP

(57) ABSTRACT

A semiconductor integrated circuit includes an output circuit driven by a power voltage across a first and a second node. A control circuit is driven by the power voltage to control output a digital signal at a pad terminal, a logic value of the signal being set by a core circuit connected to the output circuit. The digital signal causes a voltage at the first node to be high and a voltage at the second node to low when a predetermined power voltage higher than a withstanding voltage of the output circuit is applied across the first and second nodes. The control circuit controls voltages across terminals of switching elements in the output circuit to be less than their withstanding voltages and to prevent current flowing from the pad terminal to the output circuit when the first power node is in a high impedance state.

18 Claims, 10 Drawing Sheets

SEMICONDUCTOR INTEGRATED CIRCUIT

CROSS-REFERENCE TO RELATED APPLICATION

This application is based upon and claims the benefit of priority from. Japanese Patent Application No. 2016-050093, filed Mar. 14, 2016, the entire contents of which are incorporated herein by reference.

FIELD

Embodiments described herein relate generally to a semiconductor integrated circuit.

BACKGROUND

When a voltage is applied to a signal pin of an IC (Integrated Circuit) when a power source of the IC is in a cut off state, a large amount of current may flow into the IC. Therefore, the IC may be damaged or degraded in reliability. A structure for avoiding this problem is called a "Hot Swap" (hot swap) design or may be referred to as a "hot swappable" component.

A withstanding voltage of a device element, such as a MOSFET, mounted in an LSI (Large-Scale Integration) product of a state-of-the-art design process (e.g., the smallest semiconductor features) will often be lowered to 1.8 V, for example, to enable a higher speed operation and lower power consumption. However, there are mounted components for some LSI products that still are using older generation design processes that might be mounted on the same board with components using the state-of-the-art design processes. In interfacing between the different generation LSI products, data is generally exchanged at a standard signal level (for example, 3.3 V) used by the older generation LSI components. From such a circumstance, the LSI product using the state-of-the-art process employs a circuit design that requires the element to be able handle a signal at a voltage level equal to or greater than the withstanding voltage level of the element. Such a circuit design is called a "tolerant design."

When a tolerant design is implemented, the overall operation of the circuit typically becomes slower in general. In addition, there is no proposed integrated circuit design in which a tolerant design is implemented in a hot swap design of an IC.

DETAILED DESCRIPTION

In general, according to one embodiment, a semiconductor integrated circuit includes an output circuit comprising a plurality of switching elements and driven by a power voltage applied across a first power node and a second power node, and a control circuit driven by the power voltage applied across the first power node and the second power node. The control circuit is configured to control the output circuit to output a digital signal at a pad terminal. A logic value of the digital signal is set according to a signal supplied by a core circuit connected to the output circuit. The digital signal causes a voltage at the first power node to be a high level and causes a voltage at the second power node to be a low level when a predetermined power voltage, which is higher than a breakdown voltage of any one of the plurality of switching elements in the output circuit, is applied across the first power node and the second power node. The control circuit is configured to control voltage across terminals of each switching element in the plurality of switching elements to be less than the withstanding voltage of each switching element and to prevent a current flowing from the pad terminal to the output circuit when the first power node is in a high impedance state.

Hereinafter, an example embodiment of the present disclosure will be described with reference to the drawings.

Figure 1:
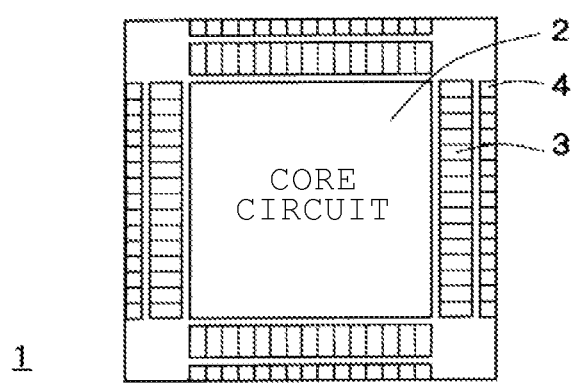
FIG. 1 is a schematic plan view illustrating a semiconductor integrated circuit according to an embodiment.

FIG. 1 is a schematic plan view of a semiconductor integrated circuit 1 according to an embodiment. The semiconductor integrated circuit 1 depicted in FIG. 1 is provided with a core circuit 2, a plurality of I/O cells 3 which are arranged to surround the core circuit 2, and a plurality of pads 4 which are arranged to surround these I/O cells 3. The core circuit 2 and each I/O cell 3 are connected to each other through, for example, a wiring pattern (not specifically illustrated). Every I/O cell 3 is connected to a corresponding pad 4 through the wiring pattern.

At least some pads 4 among the plurality of pads 4 correspond to hot swap pads. The pads 4 corresponding to the hot swap pads 4 are designed such that a large current will not flow into a circuit block (in the semiconductor integrated circuit 1) connected to the pad 4 even when a high voltage is applied to the pad 4 if a predetermined voltage (VSPEC voltage) is not also being applied to a power terminal (e.g., a different pad 4) of the semiconductor integrated circuit 1. In addition, in this embodiment, the circuit block connected to the pad 4 corresponding to the hot swap pad is configured in a tolerant design. With this configuration, there is no concern that the voltages between source-drain, gate-source, and gate-drain of any transistor in the circuit block connected to the pad 4 will exceed a withstanding voltage even if a voltage equal to or more than the withstanding voltage is applied to the pad 4. Therefore, the semiconductor integrated circuit 1 according to this embodiment can address the hot swapping requirements, and reliability will be improved by the tolerant design.

Figure 2:
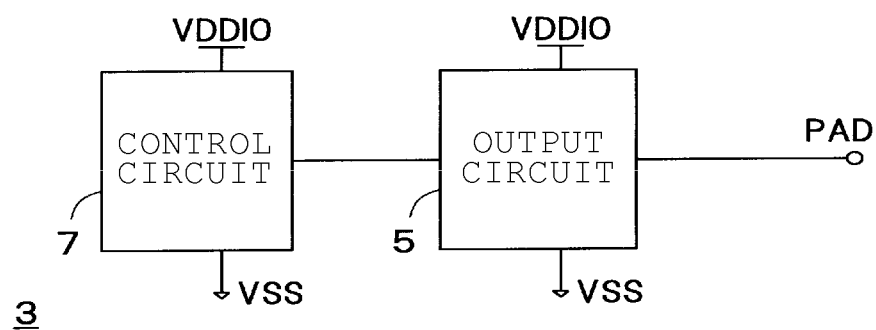
FIG. 2 is a conceptual block diagram illustrating an I/O cell depicted in FIG. 1.

FIG. 2 is a conceptual block diagram of the I/O cells 3 in FIG. 1. The I/O cell 3 depicted in FIG. 2 is provided with an output circuit 5 and a control circuit 7 which controls the output circuit 5. The output circuit 5 and the control circuit 7 are driven by a voltage applied to a first power node VDDIO and a second power node VSS.

The output circuit 5 includes an external connection terminal PAD from which a digital signal can be output. The digital signal can have the voltage at the first power node VDDIO as a high level and the voltage at the second power node VSS as a low level when the voltage between VDDIO and VSS is applied with pre-determined voltage which can be higher than withstanding voltage of all devices of the output circuit 5.

The control circuit 7 controls the voltage supplied to the output circuit 5 to be such that a voltage equal to or more than the withstanding voltage will not be applied between the terminals of any element in the output circuit 5 or the control circuit 7 regardless of the voltage levels of the first power node VDDIO, the second power node VSS, and the external connection terminal PAD. Further, the control circuit 7 cuts off the current flowing from the external connection terminal PAD to the output circuit 5 regardless of the voltage level of the external connection terminal PAD if the first power node VDDIO is in a high impedance state.

Figure 3:
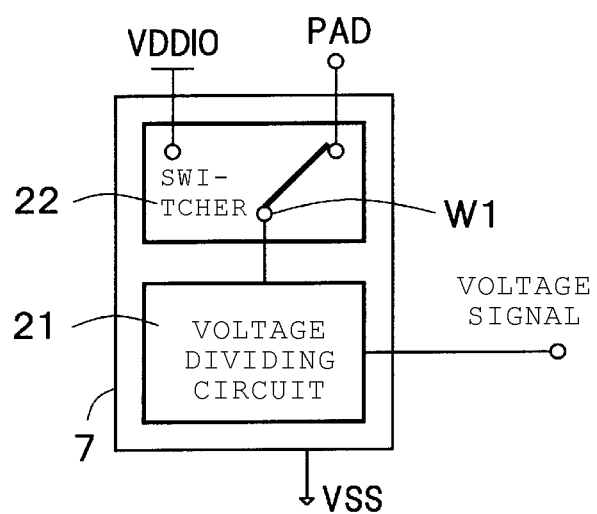
FIG. 3 is a block diagram illustrating features of a control circuit.

FIG. 3 is a block diagram illustrating features in the control circuit 7. The control circuit 7 depicted in FIG. 3 includes a voltage dividing circuit 21 and a switcher (switch) 22.

The voltage dividing circuit 21 divides a voltage applied between a node W1 and the second power node VSS. A voltage signal corresponding to the divided voltage from dividing circuit 21 is supplied to the output circuit 5. This voltage signal is a control signal set such that a voltage equal to or more than the withstanding voltage will not be applied to the transistor(s) in the output circuit. The voltage dividing circuit 21 includes a resistance potential divider circuit, for example.

The switcher 22 switches whether the first power node VDDIO is electrically connected to the voltage input node W1, or the external connection terminal PAD is electrically connected to the voltage input node W1. More specifically, the switcher 22 electrically connects the first power node VDDIO to the voltage input node W1 and cuts off the connection between the external connection terminal PAD and the voltage input node W1 in a first case where the power voltage is applied to the first power node VDDIO. Further, the switcher 22 electrically connects the external connection terminal PAD to the voltage input node W1 and cuts off the connection between the first power node VDDIO and the voltage input node W1 in a second case where the first power node VDDIO is in the high impedance state and the power voltage (e.g., digital signal) is applied to the external connection terminal PAD.

The output circuit 5 applies a voltage (not exceeding the withstanding voltage) to the elements in the output circuit 5 according to the voltage signal supplied by the voltage dividing circuit 21.

Figure 4:
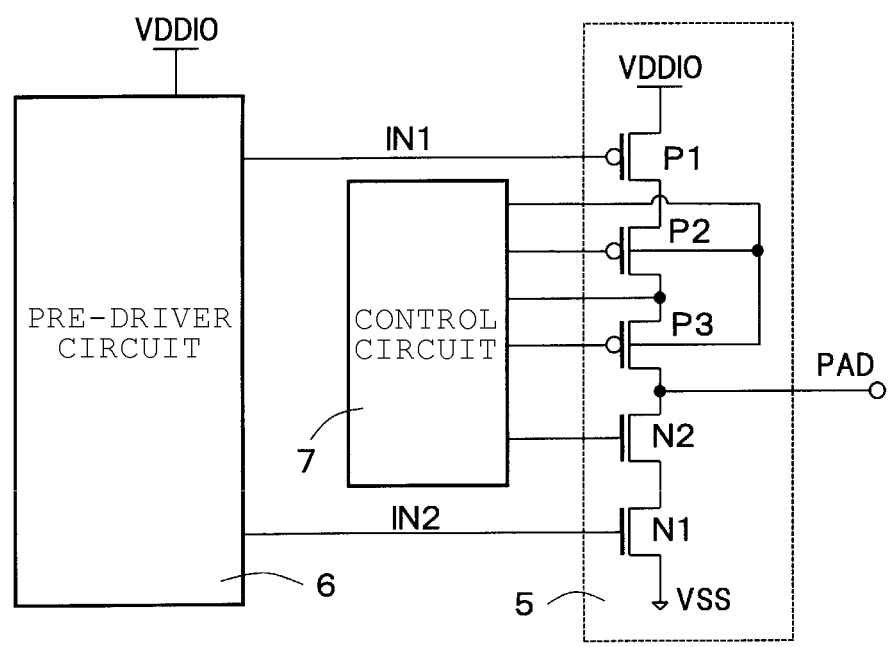
FIG. 4 is a schematic circuit diagram illustrating an I/O cell which is subjected to hot swap and tolerant design.

FIG. 4 is a schematic circuit diagram illustrating an I/O cell 3 which incorporates a tolerant design and a hot swappable design. The I/O cell 3 depicted in FIG. 4 includes the output circuit 5, a pre-driver circuit 6, and the control circuit 7.

The output circuit 5 includes a first PMOS transistor P1, a second PMOS transistor P2, and a third PMOS transistor P3 which are connected between the first power node VDDIO and the external connection terminal PAD. Further, the output circuit 5 includes a first NMOS transistor N1 and a second NMOS transistor N2 which are connected between the second power node VSS and the external connection terminal PAD.

The source of the first PMOS transistor P1 is connected to the first power node VDDIO, the drain of the first PMOS transistor P1 is connected to the source of the second PMOS transistor P2. A first signal IN1, output from the pre-driver circuit 6, is supplied to the gate of the first PMOS transistor P1.

The drain of the first NMOS transistor N1 is connected to the source of the second NMOS transistor N2. The source of the first NMOS transistor N1 is connected to the second power node VSS. A second signal IN2, output from the pre-driver circuit 6, is supplied to the gate of the first NMOS transistor N1.

The drain of the first PMOS transistor P1 and the source of the second PMOS transistor P2 may be directly connected. Alternatively, one or more PMOS transistors may be connected between the first PMOS transistor P1 and the second PMOS transistor P2. In this case, the control circuit 7 controls the voltage across the terminals of each PMOS transistor between the first PMOS transistor P1 and the second PMOS transistor P2 so as not to exceed the withstanding voltage of the transistor.

In addition, the drain of the first NMOS transistor N1 and the source of the second NMOS transistor N2 may be directly connected. Alternatively, one or more NMOS transistors may be connected in series between the drain of the first NMOS transistor N1 and the source of the second NMOS transistor N2. In this case, the control circuit 7 controls the voltage across the terminals of each NMOS transistor between the first NMOS transistor N1 and the second NMOS transistor N2 so as not to exceed the withstanding voltage of the transistor.

The semiconductor integrated circuit 1 depicted in FIG. 1 can be operated in a scenario in which a predetermined VSPEC voltage will be applied to the first power node VDDIO. When the operation of the semiconductor integrated circuit 1 depicted in FIG. 1 is stopped (non-operating), the voltage at the first power node VDDIO is set to be the same voltage (for example, a ground potential) as that at the second power node VSS. In this disclosure, a case where the VSPEC voltage is applied to the first power node VDDIO will be referred to as a "power-on state," and a case where no voltage is applied to the first power node VDDIO will be referred to as a "power-off state." In the power-off state, the first power node VDDIO goes into the high impedance state. In the high impedance state, the first power node VDDIO approaches the ground potential VSS. In this disclosure, a case where the first power node VDDIO goes into the power-on state will be referred to as the first case. A case in which the first power node VDDIO is in the power-off state and an external voltage equal to or more than a predetermined voltage level is being applied to the external connection terminal PAD will be referred to as the second case. In this disclosure, the voltage at the first power node VDDIO in the first case and the external voltage applied to the external connection terminal PAD in the second case will both be referred to as the VSPEC voltage.

The pre-driver circuit 6 is set to be operated when the VSPEC voltage is applied to the first power node VDDIO. When the VSPEC voltage is applied, the pre-driver circuit 6 outputs the logical signals (the first signal IN1 and the second signal IN2) according to a signal supplied from the core circuit 2. For the first signal IN1, the high level signal value corresponds to the VSPEC voltage, and the low level signal value corresponds to a first voltage VBIASP. For the second signal IN2, the high level signal value corresponds to a second voltage VBIASN, and the low level signal value corresponds to the ground potential (e.g., Vss). The pre-driver circuit 6 outputs the second signal IN2 at the low level when the first signal IN1 at the low level is being output, and outputs the second signal IN2 at the high level when the first signal IN1 at the high level is being output.

The control circuit 7 controls the output circuit 5 with additional control signals. More specifically, the control circuit 7 controls the gate voltages of the second PMOS transistor P2, the third PMOS transistor P3, and the second NMOS transistor N2 in the output circuit 5, the voltage at a connection node between the drain of the second PMOS transistor P2 and the source of the third PMOS transistor P3, the voltage of the base (substrate region) of the second PMOS transistor P2, and the voltage of the base of the third PMOS transistor P3.

Figure 5:
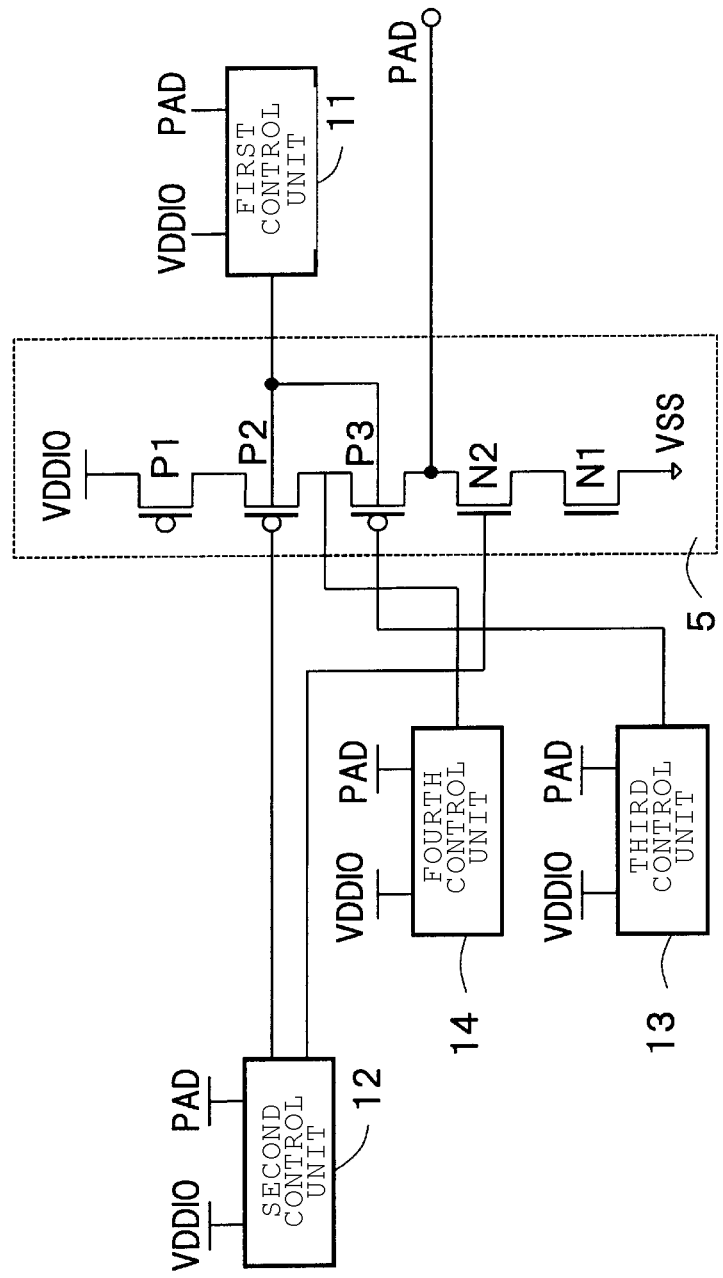
FIG. 5 is a block diagram more specifically illustrating a control circuit depicted in FIG. 2.

FIG. 5 is a block diagram more specifically illustrating the control circuit 7 depicted in FIG. 4. In FIG. 5, the pre-driver circuit 6 of FIG. 4 is omitted for simplicity of depiction, but is present in actuality. As illustrated in FIG. 5, the control circuit 7 includes first to fourth control units 11 to 14. The first control unit 11 controls the voltages of the base (substrate region) of the second PMOS transistor P2 and the base (substrate region) of the third PMOS transistor P3. The second control unit 12 controls the gate voltage of the second PMOS transistor P2 and the gate voltage of the second NMOS transistor N2. The third control unit 13 controls the gate voltage of the third PMOS transistor P3. The fourth control unit 14 controls the voltage at the connection node between the drain of the second PMOS transistor P2 and the source of the third PMOS transistor P3.

As illustrated in FIG. 5, the first power node VDDIO and the external connection terminal PAD are connected to each of the first to fourth control units 11 to 14. The first to fourth control units 11 to 14 generate the respective output voltages from the voltage supplied at the first power node VDDIO and the external connection terminal PAD.

More specifically, in the first case (power-on state and VSPEC supplied to the first power node VDDIO), the first control unit 11 electrically connects the base of the second PMOS transistor P2 and the base of the third PMOS transistor P3 to the first power node VDDIO, and thus applies the VSPEC voltage from the first power node VDDIO to both bases. In the second case (power-off state and VSPEC supplied to the external connection terminal PAD), the first control unit 11 electrically connects the base of the second PMOS transistor P2 and the base of the third PMOS transistor P3 to the external connection terminal PAD, and thus applies the VSPEC voltage from the external connection terminal PAD to both bases.

The second control unit 12 generates the first voltage VBIASP and the second voltage VBIASN. In the first case, the second control unit 12 applies the first voltage VBIASP to the gate of the second PMOS transistor P2 and applies the second voltage VBIASN to the gate of the second NMOS transistor N2. In the second case, the second control unit 12 applies the first voltage VBIASP to the gate of the second PMOS transistor P2 and applies the second voltage VBIASN to the gate of the second NMOS transistor N2.

The first voltage VBIASP is equal to or more than the voltage at the second power node VSS and equal to or less than the VSPEC voltage, and max (VBIASP, (VSPEC−VBIASP)) is less than the withstanding voltages of the transistors in the output circuit 5 and the control circuit 7, (VBIASP−VSPEC) is lower than threshold voltages of the PMOS transistors in the output circuit 5 and the control circuit 7, and (VSPEC−VBIASP) is higher than threshold voltages of the NMOS transistors in the output circuit 5 and the control circuit 7. Herein, the withstanding voltage of the transistor can be considered to be a maximum allowable voltage that can be applied across gate-source, gate-drain, source-drain, or gate-base terminals of the transistor (when the transistor is turned off). Here, "allowable" is set from a viewpoint of expected reliability and/or continued reliability of the transistor. In general, the withstanding voltage between drain-base terminals and source-base terminals is usually higher than that between the other terminals, and thus descriptions thereof will not be further discussed in this disclosure. The withstanding voltage between gate-base terminals when the transistor is turned on will also not be further discussed in this disclosure since an inversion layer is formed below a gate oxide film and the voltage actually applied to the gate oxide film can be considered as substantially equal to the potential between gate-source terminals.

The second voltage VBIASN is equal to or more than the voltage at the second power node VSS and equal to or less than the VSPEC voltage, and max(VBIASN, (VSPEC−VBIASN)) is less than the withstanding voltages of the transistors in the output circuit 5 and the control circuit 7, and the second voltage VBIASN is higher than the threshold voltages of the NMOS transistors in the output circuit 5 and the control circuit 7.

The third control unit 13 applies the first voltage VBIASP to the gate of the third PMOS transistor P3 in the first case (where the VSPEC voltage is being applied to the first power node VDDIO). Further, the third control unit 13 electrically connects the gate of the third PMOS transistor P3 to the external connection terminal PAD (so as to be at the VSPEC voltage) in the second case (when the first power node VDDIO is in the high impedance state and an external voltage equal to or more than a predetermined voltage level is being applied to the external connection terminal PAD).

The fourth control unit 14 electrically connects a connection node between the drain of the second PMOS transistor P2 and the source of the third PMOS transistor P3 to the first voltage VBIASP in the second case (where the first power node VDDIO is in the high impedance state and an external voltage (the VSPEC voltage) equal to or more than the predetermined voltage level is being applied to the external connection terminal PAD). In this second case, the first voltage VBIASP is applied to the connection node. The connection node is disconnected from the first voltage VBIASP in any case other than the second case.

Figure 6A:
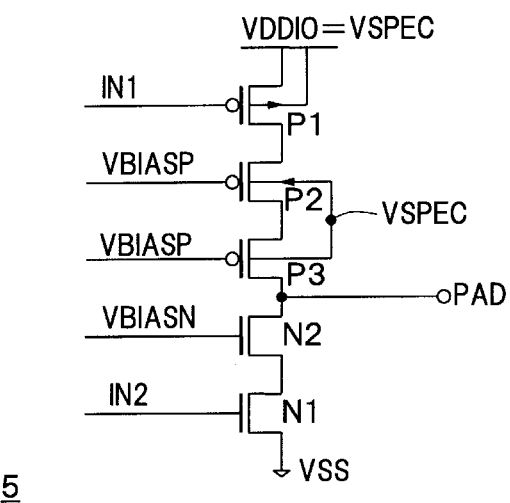
FIG. 6A is a diagram illustrating voltages applied to second to third PMOS transistors and a second NMOS transistor in a first case.
Figure 6B:
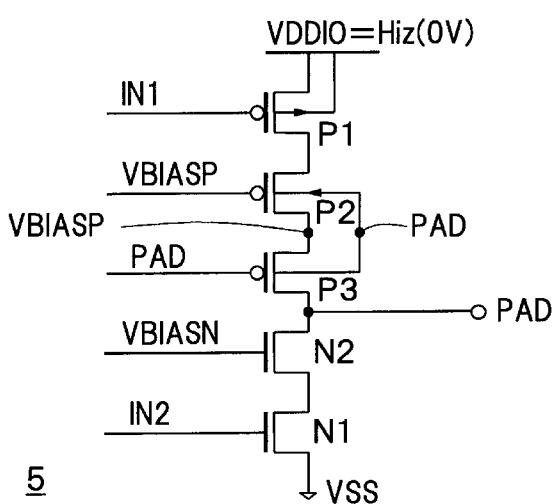
FIG. 6B is a diagram illustrating voltages applied to second and third PMOS transistors and a second NMOS transistor in a second case.

FIGS. 6A and 6B are diagrams illustrating the voltages applied to the second PMOS transistor P2, the third PMOS transistor P3, and the second NMOS transistor N2. FIG. 6A illustrates the first case (where the VSPEC voltage is being applied to the first power node VDDIO). FIG. 6B illustrates the second case (where the first power node VDDIO is in the high impedance state and an external voltage (the VSPEC voltage) equal to or more than the predetermined voltage level is being applied to the external connection terminal PAD).

As illustrated in FIG. 6A, in the first case, the first voltage VBIASP is applied to the gate of the second PMOS transistor P2 and the gate of the third PMOS transistor P3; the VSPEC voltage is applied to the base of the second PMOS transistor P2 and the base of the third PMOS transistor P3; and the second voltage VBIASN is applied to the gate of the second NMOS transistor N2.

As illustrated in FIG. 6B, in the second case, the first voltage VBIASP is applied to the gate and the drain of the second PMOS transistor P2; an external voltage (PAD voltage) is applied to the base of the second PMOS transistor P2, the base of the third PMOS transistor P3, and the gate of the third PMOS transistor P3; and the second voltage VBIASN is applied to the gate of the second NMOS transistor N2.

As described below, the voltage applied between source-drain, gate-source, or gate-drain of each transistor does not exceed the withstanding voltage when the voltages are applied as illustrated in FIG. 6A (in the first case) or as illustrated in FIG. 6B (in the second case). Therefore, a tolerant design is provided.

Next, the description will be made about the operations of the output circuit 5 and the control circuit 7 in the first case (where the VSPEC voltage is applied to the first power node VDDIO).

In the first case, the base of the second PMOS transistor P2 and the base of the third PMOS transistor P3 are electrically connected to the VSPEC voltage by the first control unit 11. In addition, the second control unit 12 and the third control unit 13 apply the first voltage VBIASP to the gate of the second PMOS transistor P2 and the gate of the third PMOS transistor P3, and apply the second voltage VBIASN to the gate of the second NMOS transistor N2. In addition, the connection node between the drain of the second PMOS transistor P2 and the source of the third PMOS transistor P3 is not driven by the fourth control unit 14.

When the core circuit 2 outputs a high level signal, the first signal IN1 and the second signal IN2 output from the pre-driver circuit 6 become the high level. The first signal IN1 has the VSPEC voltage, and the second signal IN2 has the second voltage VBIASN. Therefore, the first PMOS transistor P1 is turned off, and the first NMOS transistor N1 is turned on. Accordingly, the drain of the first NMOS transistor N1 has a ground potential and the second NMOS transistor N2 is also turned on. When the first PMOS transistor P1 is turned off, the voltage of the external connection terminal PAD, the source voltage of the second PMOS transistor P2, and the source voltage of the third PMOS transistor P3 are lowered. When source voltages of both the second PMOS transistor P2 and the third PMOS transistor P3 are lowered down to a level near the first voltage VBIASP, the second PMOS transistor P2 and the third PMOS transistor P3 both are turned off. Accordingly, at this time, the external connection terminal PAD has the ground potential level. In this state, the source and the gate of the first PMOS transistor P1 have the VSPEC voltage, and the drain thereof has the first voltage VBIASP. The source, the gate, and the drain of the second PMOS transistor P2 have the first voltage VBIASP. The source and the gate of the third PMOS transistor P3 have the first voltage VBIASP, and the drain thereof has the ground potential. The drain and the source of the second NMOS transistor N2 have the ground potential, and the gate thereof has the second voltage VBIASN. The drain and the source of the first NMOS transistor N1 have the ground potential, and the gate thereof has the VSPEC voltage. Accordingly, the gate-source, the source-drain, and the gate-drain terminals of the first to third PMOS transistors P1 to P3 and the first and second NMOS transistors N1 and N2 are not subjected to a voltage equal to or more than the withstanding voltage.

When the core circuit 2 outputs a low signal, the first signal IN1 and the second signal IN2 that are output from the pre-driver circuit 6 have the low level, the first signal IN1 has the first voltage VBIASP, and the second signal IN2 has the ground potential. Therefore, the first PMOS transistor P1 is turned on, and the first NMOS transistor N1 is turned off. Accordingly, the source voltage of the second PMOS transistor P2 has the VSPEC voltage, and the second PMOS transistor P2 is turned on. In addition, the source of the third PMOS transistor P3 also has the VSPEC voltage, and the third PMOS transistor P3 is also turned on. At this time, the gate of the second NMOS transistor N2 has the second voltage VBIASN, and the voltage of the external connection terminal PAD and the source voltage of the second NMOS transistor N2 are increased. Since the source voltage of the second NMOS transistor N2 has the second voltage VBIASN, the second NMOS transistor N2 is turned off. Accordingly, at this time, the external connection terminal PAD has the VSPEC voltage level. In this state, the gate of the first PMOS transistor P1 has the first voltage VBIASP, and the source and the drain thereof have the VSPEC voltage. The gate of the second PMOS transistor P2 has the first voltage VBIASP, and the source and the drain thereof have the VSPEC voltage. The gate of the third PMOS transistor P3 has the first voltage VBIASP, and the source and the drain thereof have the VSPEC voltage. The withstanding voltages of the PMOS transistors are thus not exceeded. In addition, the gate and the source of the first NMOS transistor N1 are the ground potential, and the drain thereof is the second voltage VBIASN. The gate and the source of the second NMOS transistor N2 are the second voltage VBIASN, and the drain thereof is the VSPEC voltage. The withstanding voltages of the NMOS transistors are thus not exceeded.

Next, the description will be made about the operations of the output circuit 5 and the control circuit 7 in the second case (where the first power node VDDIO is in the high impedance state and an external voltage (the VSPEC voltage) equal to or more than the predetermined voltage level is being applied to the external connection terminal PAD).

In the second case, the first control unit 11 electrically connects the base of the second PMOS transistor P2 and the base of the third PMOS transistor P3 to the external connection terminal PAD. Accordingly, since a parasitic PN junction diode between drain-base of the third PMOS transistor P3 is not turned on (forward biased), the current path from the external connection terminal PAD to the base of the third PMOS transistor P3 and the base of the second PMOS transistor P2 is cut off. In addition, the gate of the third PMOS transistor P3 is equalized/set to the external voltage by the second control unit 12 and the third control unit 13. Accordingly, the third PMOS transistor P3 is turned off, and the current path from the external connection terminal PAD to the drain-source of the third PMOS transistor P3 is cut off.

In addition, the connection node between the drain of the second PMOS transistor P2 and the source of the third PMOS transistor P3 has the first voltage VBIASP as applied by the fourth control unit 14.

In the second case, the first power node VDDIO is in the high impedance state. The output of the pre-driver circuit 6 is also in the high impedance state. The gate of the first PMOS transistor P1 has the ground potential. The gate of the first NMOS transistor N1 also has the ground potential. Since the first PMOS transistor P1 is turned off and the second PMOS transistor P2 is also turned off, the connection node between the drain of the first PMOS transistor P1 and the source of the second PMOS transistor P2 goes into the high impedance state, and has the ground potential.

The connection node between the drain of the first NMOS transistor N1 and the source of the second NMOS transistor N2 approaches the second voltage VBIASN since the gate of the second NMOS transistor N2 is the second voltage VBIASN, the drain of the second NMOS transistor N2 is the external voltage, and the channel of the first NMOS transistor N1 is turned off.

The drain, the source, the gate, and the base of the first PMOS transistor P1 are all the ground potential. Thus, the voltage across any two terminals of the first PMOS transistor P1 will not exceed the withstanding voltage.

Similarly, the gate of the second PMOS transistor P2 has the first voltage VBIASP, the source of the second PMOS transistor P2 has the ground potential, the drain of the second PMOS transistor P2 has the first voltage VBIASP, and the base of the second PMOS transistor P2 has the external voltage. Thus, the voltage across any two terminals of the second PMOS transistor P2 will not exceed the withstanding voltage.

Similarly, the gate of the third PMOS transistor P3 has the external voltage, the source of the third PMOS transistor P3 has the first voltage VBIASP, the drain of the third PMOS transistor P3 has the external voltage, and the base of the third PMOS transistor P3 has the external voltage. Thus, the voltage across any two terminals of the third PMOS transistor P3 will not exceed the withstanding voltage.

Similarly, the drain of the first NMOS transistor N1 has the second voltage VBIASN, and the source, the gate, and the base thereof are the ground potential. Thus, the voltage across any two terminals of the first NMOS transistor N1 will not exceed the withstanding voltage.

Similarly, the drain of the second NMOS transistor N2 has the external voltage, the source thereof has the second voltage VBIASN, the gate thereof has the second voltage VBIASN, and the base thereof has the ground potential. Thus, the voltage across any two terminals of the second NMOS transistor N2 will not exceed the withstanding voltage.

Next, the description will be provided for the inner configurations of the first control unit 11 to the fourth control unit 14 in the control circuit 7. However, the circuit diagrams of the inner configurations of the first control unit 11 to the fourth control unit 14 are not necessarily limited to the following example circuits.

Figure 7:
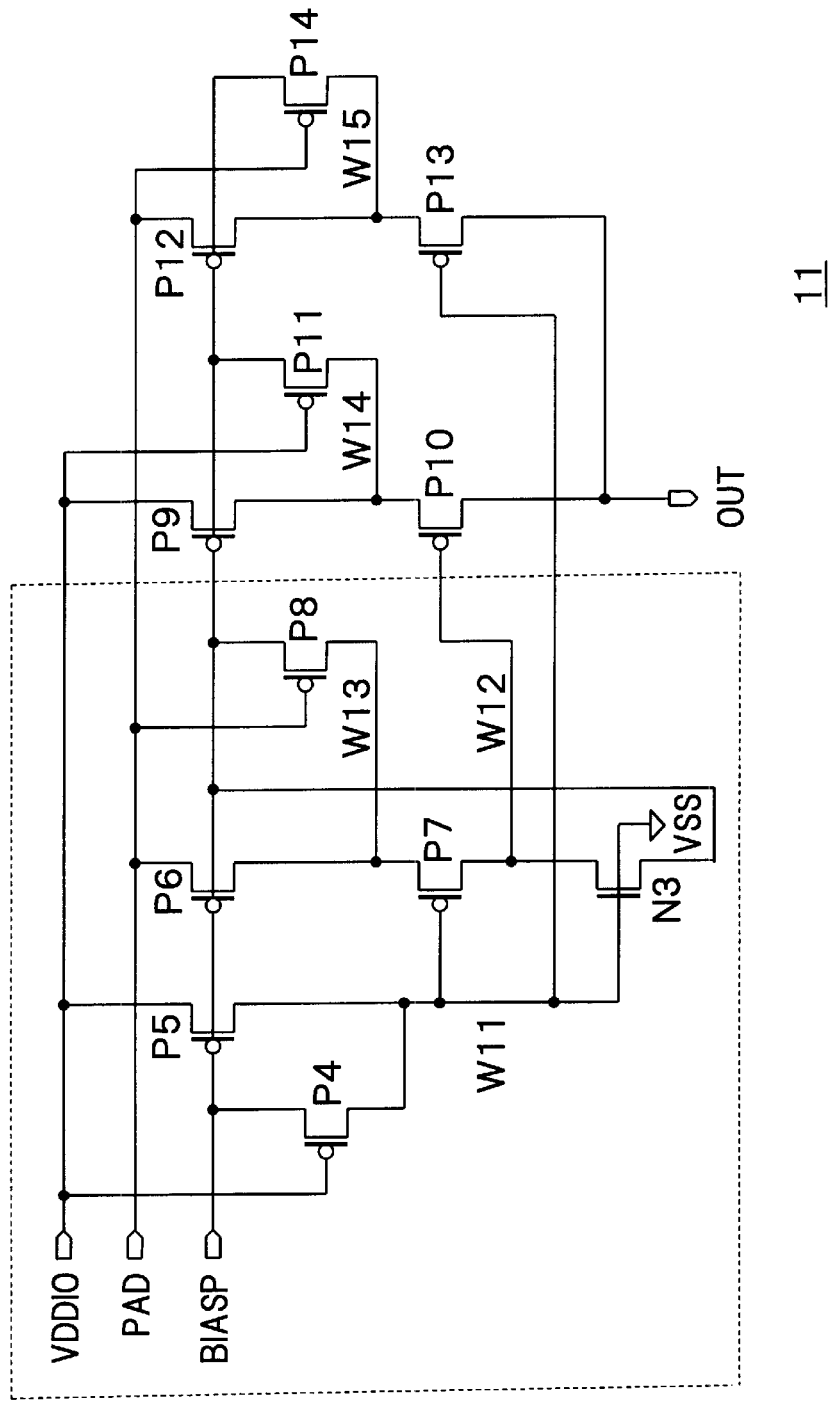
FIG. 7 is a circuit diagram illustrating an example configuration of a first control unit.

FIG. 7 is a circuit diagram illustrating an example inner configuration of the first control unit 11. The first control unit 11 depicted in FIG. 7 includes fourth to fourteenth PMOS transistors P4 to P14 and a third NMOS transistor N3. The first control unit 11 includes, for example, the first power node VDDIO (through which the VSPEC voltage is applied in the first case), the second power node VSS (which is set to the ground potential), the external connection terminal PAD (to which the external voltage is input), an output node OUT, and a first voltage node BIASP. The first voltage node BIASP has the first voltage VBIASP applied thereto in the first case and the second case. The bases of all the PMOS transistors of the first control unit 11 are electrically connected to the first power node VDDIO, and applied with the VSPEC voltage in the first case. The bases are electrically connected to the external connection terminal PAD and applied with the VSPEC voltage in the second case.

The fourth PMOS transistor P4 includes a source, which is connected to the first voltage node BIASP, and a gate, which is connected to the first power node VDDIO.

The fifth PMOS transistor P5 includes a source, which is connected to the first power node VDDIO, a drain, which is connected to the drain of the fourth PMOS transistor P4, and a gate, which is connected to the first voltage node BIASP. The sixth PMOS transistor P6 includes a source, which is connected to the external connection terminal PAD, and a gate, which is connected to the first voltage node BIASP.

The seventh PMOS transistor P7 includes a source, which is connected to the drain of the sixth PMOS transistor P6, and a gate, which is connected to both drains of the fourth PMOS transistor P4 and the fifth PMOS transistor P5. The third NMOS transistor N3 includes a drain, which is connected to the drain of the seventh PMOS transistor P7, a source, which is connected to the first voltage node BIASP, and a gate, which is connected to the gate of the seventh PMOS transistor P7.

The eighth PMOS transistor P8 includes a source, which is connected to the first voltage node BIASP, a drain, which is connected to the source of the seventh PMOS transistor P7, and a gate, which is connected to the external connection terminal PAD. The ninth PMOS transistor P9 includes a source, which is connected to the first power node VDDIO, and a gate, which is connected to the first voltage node BIASP.

The tenth PMOS transistor P10 includes a source, which is connected to the drain of the ninth PMOS transistor P9, a drain, which is connected to the output node OUT of the first control unit 11, and a gate, which is connected to the drain of the seventh PMOS transistor P7. The eleventh PMOS transistor P11 includes a source, which is connected to the first voltage node BIASP, a drain, which is connected to the source of the tenth PMOS transistor P10, and a gate, which is connected to the first power node VDDIO.

The twelfth PMOS transistor P12 includes a source, which is connected to the external connection terminal PAD, and a gate, which is connected to the first voltage node BIASP. The thirteenth PMOS transistor P13 includes a source, which is connected to the drain of the twelfth PMOS transistor P12, a drain, which is connected to the output node OUT of the first control unit 11, and a gate, which is connected to the drain of the fourth PMOS transistor P4. The fourteenth PMOS transistor P14 includes a source, which is connected to the first voltage node BIASP, a drain, which is connected to the source of the thirteenth PMOS transistor P13, and a gate, which is connected to the external connection terminal PAD.

Hereinafter, the description of the operation of the first control unit 11 in the first case (where the VSPEC voltage is applied to the first power node VDDIO). In the first case, the fifth PMOS transistor P5 is turned on, and the fourth PMOS transistor P4 is turned off. Therefore, the drain (a node W11) of the fifth PMOS transistor P5 has the VSPEC voltage. Accordingly, the seventh PMOS transistor P7 is turned off, the third NMOS transistor N3 is turned on, and the drain (a node W12) of the third NMOS transistor N3 has the first voltage VBIASP.

Herein, when the external connection terminal PAD is at the low level (e.g., the ground potential), the eighth PMOS transistor P8 is turned on, and the drain (a node W13) of the eighth PMOS transistor P8 has the first voltage VBIASP. In addition, the ninth PMOS transistor P9 is turned on, and the source of the tenth PMOS transistor P10 has the VSPEC voltage. Since the node W12 has the first voltage VBIASP, the tenth PMOS transistor P10 is turned on. Accordingly, the output node OUT connected to the drain of the tenth PMOS transistor P10 has the VSPEC voltage. In addition, the eleventh PMOS transistor P11 is turned off, the twelfth PMOS transistor P12 is turned off, and the fourteenth PMOS transistor P14 is turned on. Accordingly, a node W15 connected to the drain of the fourteenth PMOS transistor P14 has the first voltage VBIASP. Accordingly, the thirteenth PMOS transistor P13 is turned off.

When it is the first case and the external connection terminal PAD is at the low level, the gate of the fourth PMOS transistor P4 has the VSPEC voltage, the source thereof has the first voltage VBIASP, and the drain thereof has the VSPEC voltage. Therefore, the withstanding voltage of the fourth PMOS transistor P4 is not exceeded. The gate of the fifth PMOS transistor P5 has the first voltage VBIASP, and the source and the drain thereof have the VSPEC voltage. Therefore, the withstanding voltage of the fifth PMOS transistor P5 is not exceeded. The gate of the sixth PMOS transistor P6 has the first voltage VBIASP, the source thereof has the ground potential, and the drain thereof has the first voltage VBIASP. Therefore, the withstanding voltage of the sixth PMOS transistor P6 is not exceeded. The gate of the seventh PMOS transistor P7 has the VSPEC voltage, and the source and the drain thereof have the first voltage VBIASP. Therefore, the withstanding voltage of the seventh PMOS transistor P7 is not exceeded. The gate of the eighth PMOS transistor P8 has the ground potential, and the source and the drain thereof have the first voltage VBIASP. Therefore, the withstanding voltage of the eighth PMOS transistor P8 is not exceeded. The gate of the ninth PMOS transistor P9 has the first voltage VBIASP, and the source and the drain thereof have the VSPEC voltage. Therefore, the withstanding voltage of the ninth PMOS transistor P9 is not exceeded. The gate of the tenth PMOS transistor P10 has the first voltage VBIASP, and the source and the drain thereof have the VSPEC voltage. Therefore, the withstanding voltage of the tenth PMOS transistor P10 is not exceeded. The gate of the eleventh PMOS transistor P11 has the VSPEC voltage, the source thereof has the first voltage VBIASP, and the drain thereof has the VSPEC voltage. Therefore, the withstanding voltage of the eleventh PMOS transistor P11 is not exceeded. The gate of the twelfth PMOS transistor P12 has the first voltage VBIASP, the source thereof has the ground potential, and the drain thereof has the first voltage VBIASP. Therefore, the withstanding voltage of the twelfth PMOS transistor P12 is not exceeded. The gate and the drain of the thirteenth PMOS transistor P13 have the VSPEC voltage, and the source thereof has the first voltage VBIASP. Therefore, the withstanding voltage of the thirteenth PMOS transistor P13 is not exceeded. The gate of the fourteenth PMOS transistor P14 has the ground potential, the source thereof has the first voltage VBIASP, and the drain thereof has the first voltage VBIASP. Therefore, the withstanding voltage of the fourteenth PMOS transistor P14 is not exceeded. The gate of the third NMOS transistor N3 has the VSPEC voltage, and the drain and the source thereof have the first voltage VBIASP. Therefore, the withstanding voltage of the third NMOS transistor N3 is not exceeded.

On the other hand, when the external connection terminal PAD is at the high level (e.g., the VSPEC voltage), the fourth PMOS transistor P4 is turned off, and the fifth PMOS transistor P5 is turned on. Therefore, the node W11 has the VSPEC voltage. In addition, the sixth PMOS transistor P6 is turned on, the seventh PMOS transistor P7 is turned off, and the third NMOS transistor N3 is turned on. Accordingly, the node W13 has the VSPEC voltage, and the node W12 has the first voltage VBIASP. In addition, the eighth PMOS transistor P8 is turned off, the ninth PMOS transistor P9 is turned on, and the tenth PMOS transistor P10 is turned on. Accordingly, a node W14 and the output node OUT have the VSPEC voltage. In addition, the eleventh PMOS transistor P11 is turned off, the twelfth PMOS transistor P12 is turned on, the thirteenth PMOS transistor P13 is turned off, and the fourteenth PMOS transistor P14 is turned off. Accordingly, the node W15 has the VSPEC voltage.

When it is the first case and the external connection terminal PAD is at the high level, the gate of the fourth PMOS transistor P4 has the VSPEC voltage, the source thereof has the first voltage VBIASP, and the drain thereof has the VSPEC voltage. Therefore, the withstanding voltage of the fourth PMOS transistor P4 is not exceeded. The gate of the fifth PMOS transistor P5 has the first voltage VBIASP, the source and the drain thereof have the VSPEC voltage. Therefore, the withstanding voltage of the fifth PMOS transistor P5 is secured. The gate of the sixth PMOS transistor P6 has the first voltage VBIASP, and the source and the drain thereof have the VSPEC voltage. Therefore, the withstanding voltage of the sixth PMOS transistor P6 is not exceeded. The gate of the seventh PMOS transistor P7 has the VSPEC voltage, the source thereof has the VSPEC voltage, and the drain thereof has the first voltage VBIASP. Therefore, the withstanding voltage of the seventh PMOS transistor P7 is not exceeded. The gate of the eighth PMOS transistor P8 has the VSPEC voltage, the source thereof has the first voltage VBIASP, and the drain thereof has the VSPEC voltage. Therefore, the withstanding voltage of the eighth PMOS transistor P8 is not exceeded. The gate of the ninth PMOS transistor P9 has the first voltage VBIASP, and the source and the drain thereof have the VSPEC voltage. Therefore, the withstanding voltage of the ninth PMOS transistor P9 is not exceeded. The gate of the tenth PMOS transistor P10 has the first voltage VBIASP, and the source and the drain thereof have the VSPEC voltage. Therefore, the withstanding voltage of the tenth PMOS transistor P10 is not exceeded. The gate of the eleventh PMOS transistor P11 has the VSPEC voltage, the source thereof has the first voltage VBIASP, and the drain thereof has the VSPEC voltage. Therefore, the withstanding voltage of the eleventh PMOS transistor P11 is not exceeded. The gate of the twelfth PMOS transistor P12 has the first voltage VBIASP, the source and the drain thereof have the VSPEC voltage. Therefore, the withstanding voltage of the twelfth PMOS transistor P12 is not exceeded. The gate, the source, and the drain of the thirteenth PMOS transistor P13 have the VSPEC voltage. Therefore, the withstanding voltage of the thirteenth PMOS transistor P13 is not exceeded. The gate of the fourteenth PMOS transistor P14 has the VSPEC voltage, the source thereof has the first voltage VBIASP, and the drain thereof has the VSPEC voltage. Therefore, the withstanding voltage of the fourteenth PMOS transistor P14 is not exceeded. The gate of the third NMOS transistor N3 has the VSPEC voltage, and the drain and the source thereof have the first voltage VBIASP. Therefore, the withstanding voltage of the third NMOS transistor N3 is not exceeded.

Next, the description will be made about the operation of the first control unit 11 in the second case where the first power node VDDIO is in the high impedance state and the external voltage VSPEC equal to or more than the predetermined voltage level is applied to the external connection terminal PAD. In the second case, the fourth PMOS transistor P4 is turned on, and the fifth PMOS transistor P5 is turned off. Accordingly, the node W11 has the first voltage VBIASP. In addition, the sixth PMOS transistor P6 and the seventh PMOS transistor P7 are turned on, and the third NMOS transistor N3 is turned off. Accordingly, the node W12 has the VSPEC voltage.

In addition, the eighth PMOS transistor P8 is turned off, the ninth PMOS transistor P9 is turned off, and the twelfth PMOS transistor P12 is turned on. The node W11 has the first voltage VBIASP, the node W12 has the VSPEC voltage, and the node W15 has the VSPEC voltage. Therefore, the tenth PMOS transistor P10 is turned off, and the thirteenth PMOS transistor P13 is turned on. Accordingly, the external connection terminal PAD of the VSPEC voltage is electrically connected to the output node OUT through the twelfth PMOS transistor P12 and the thirteenth PMOS transistor P13, and the output node OUT has the VSPEC voltage. In addition, the eleventh PMOS transistor P11 is turned on, and the node W14 has the first voltage VBIASP.

In the second case, the gate of the fourth PMOS transistor P4 has the ground potential, and the source and the drain thereof have the first voltage VBIASP. Therefore, the withstanding voltage of the fourth PMOS transistor P4 is not exceeded. The gate of the fifth PMOS transistor P5 has the first voltage VBIASP, the source thereof has the ground potential, and the drain thereof has the first voltage VBIASP. Therefore, the withstanding voltage of the fifth PMOS transistor P5 is not exceeded. The gate of the sixth PMOS transistor P6 has the first voltage VBIASP, and the source and the drain thereof have the VSPEC voltage. Therefore, the withstanding voltage of the sixth PMOS transistor P6 is not exceeded. The gate of the seventh PMOS transistor P7 has the first voltage VBIASP, and the source and the drain thereof have the VSPEC voltage. Therefore, the withstanding voltage of the seventh PMOS transistor P7 is not exceeded. The gate of the eighth PMOS transistor P8 has the VSPEC voltage, the source thereof has the first voltage VBIASP, and the drain thereof has the VSPEC voltage. Therefore, the withstanding voltage of the eighth PMOS transistor P8 is not exceeded. The gate of the ninth PMOS transistor P9 has the first voltage VBIASP, the source thereof has the ground potential, and the drain thereof has the first voltage VBIASP. Therefore, the withstanding voltage of the ninth PMOS transistor P9 is not exceeded. The gate of the tenth PMOS transistor P10 has the VSPEC voltage, the source thereof has the first voltage VBIASP, and the drain thereof has the VSPEC voltage. Therefore, the withstanding voltage of the tenth PMOS transistor P10 is not exceeded. The gate of the eleventh PMOS transistor P11 has the ground potential, and the source and the drain thereof have the first voltage VBIASP. Therefore, the withstanding voltage of the eleventh PMOS transistor P11 is not exceeded. The gate of the twelfth PMOS transistor P12 has the first voltage VBIASP, and the source and the drain thereof have the VSPEC voltage. Therefore, the withstanding voltage of the twelfth PMOS transistor P12 is not exceeded. The gate of the thirteenth PMOS transistor P13 has the first voltage VBIASP, and the source and the drain thereof have the VSPEC voltage. Therefore, the withstanding voltage of the thirteenth PMOS transistor P13 is not exceeded. The gate of the fourteenth PMOS transistor P14 has the VSPEC voltage, the source thereof has the first voltage VBIASP, and the drain thereof has the VSPEC voltage. Therefore, the withstanding voltage of the fourteenth PMOS transistor P14 is not exceeded. The gate of the third NMOS transistor N3 has the first voltage VBIASP, the drain thereof has the VSPEC voltage, and the source thereof has the first voltage VBIASP. Therefore, the withstanding voltage of the third NMOS transistor N3 is not exceeded.

Figure 8:
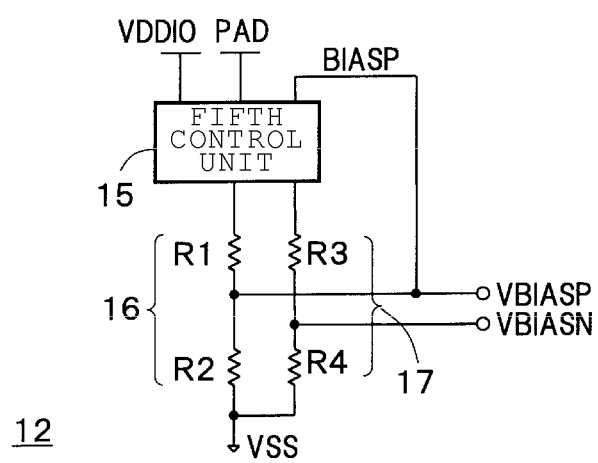
FIG. 8 is a block diagram illustrating an example configuration of a second control unit.

FIG. 8 is a block diagram illustrating an exemplary inner configuration of the second control unit 12. The second control unit 12 in FIG. 8 includes a fifth control unit 15, a first potential divider 16, and a second potential divider 17. The fifth control unit 15 corresponds to the switcher 22 depicted in FIG. 3, and the first potential divider 16 and the second potential divider 17 correspond to the voltage dividing circuit 21 depicted in FIG. 3.

The fifth control unit 15 includes the same circuit configuration as that of the first control unit 11. The fifth control unit 15 outputs the VSPEC voltage in the first case where the VSPEC voltage is applied to the first power node VDDIO. The fifth control unit 15 also outputs the VSPEC voltage in the second case where the first power node VDDIO is in the high impedance state and the external voltage (here, the VSPEC voltage) equal to or more than the predetermined voltage level is applied to the external connection terminal PAD. The fifth control unit 15 includes the same circuit configuration as that depicted in FIG. 7 (for the first control unit 11), for example.

The first potential divider 16 generates the first voltage VBIASP from an output voltage of the fifth control unit 15. For example, the first potential divider 16 includes two resistors R1 and R2 connected in series between an output node OUT of the fifth control unit 15 and the second power node VSS. The first voltage VBIASP is output from the connection node of these resistors R1 and R2. The first voltage VBIASP is thus obtained as VSPEC×R2/(R1+R2).

The second potential divider 17 generates the second voltage VBIASN from an output voltage of the fifth control unit 15. For example, the first potential divider 16 includes two resistors R3 and R4 connected in series between the output node OUT of the fifth control unit 15 and the second power node VSS. The second voltage VBIASN is output from the connection node of these resistors R3 and R4. The second voltage VBIASN is thus obtained as VSPEC×R3/(R3+R4).

Here, since the fifth control unit 15 includes the same circuit configuration therein as that depicted for the first control unit 11 in FIG. 7, the withstanding voltages of transistors in the fifth control unit 15 are similarly secured (not exceeded) in both the first and second cases in a manner similar to the transistors in the first control unit 11.

Further, the inner configurations of the first potential divider 16 and the second potential divider 17 are not limited to the particular circuit illustrated in FIG. 8.

Figure 9:
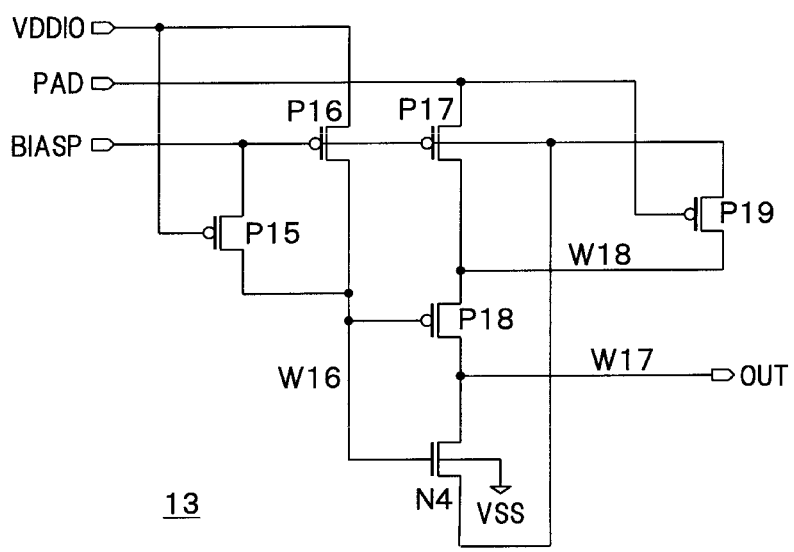
FIG. 9 is a circuit diagram illustrating an example configuration of a third control unit.

FIG. 9 is a circuit diagram illustrating an exemplary inner configuration of the third control unit 13. The third control unit 13 in FIG. 9 includes a fifteenth PMOS transistor P15 to a nineteenth PMOS transistor P19, and a fourth NMOS transistor N4.

The fifteenth PMOS transistor P15 includes a source connected to the first voltage node BIASP to which the first voltage VBIASP is applied in the first case or the second case, and a gate, which is connected to the first power node VDDIO.

The sixteenth PMOS transistor P16 includes a source connected to the first power node VDDIO, a drain, which is connected to the drain of the fifteenth PMOS transistor P15, and a gate, which is connected to the first voltage node BIASP.

The seventeenth PMOS transistor P17 includes a source, which is connected to the external connection terminal PAD, and a gate, which is connected to the first voltage node BIASP.

The eighteenth PMOS transistor P18 includes a source, which is connected to the drain of the seventeenth PMOS transistor P17, and a gate, which is connected to the drain of the fifteenth PMOS transistor P15.

The nineteenth PMOS transistor P19 includes a source, which is connected to the first voltage node BIASP, a drain, which is connected to the drain of the seventeenth PMOS transistor P17, and a gate, which is connected to the external connection terminal PAD.

The fourth NMOS transistor N4 includes a drain, which is connected to the drain of the eighteenth PMOS transistor P18 and the output node OUT of the third control unit 13, a source, which is connected to the first voltage node BIASP, and a gate, which is connected to the gate of the eighteenth PMOS transistor P18.

The third control unit 13 depicted in FIG. 9 includes the same circuit configuration as within a section surrounded by the dotted line in the first control unit 11 depicted in FIG. 7 (that is, an arrangement of a fourth PMOS transistor P4 to an eighth PMOS transistor P8 and a third NMOS transistor N3 shown in FIG. 7 is similar to that shown in FIG. 9). However, the third control unit 13, a connection node W12 between the drain of the seventh PMOS transistor P7 and the drain of the third NMOS transistor N3 corresponds to an output node OUT of the third control unit 13. The circuit configuration in FIG. 9 is otherwise substantially the same as that within the dotted line surrounded section of FIG. 7, and thus the detailed description of the corresponding components in FIG. 9 will not be repeated.

Figure 10:
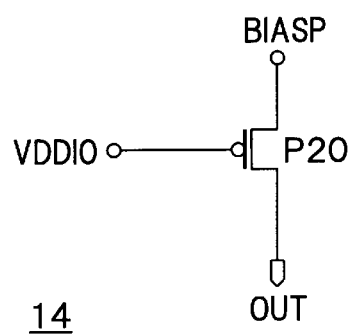
FIG. 10 is a circuit diagram illustrating an example configuration of a fourth control unit.

FIG. 10 is a circuit diagram illustrating an exemplary inner configuration of the fourth control unit 14. The fourth control unit 14 depicted in FIG. 10 includes a twentieth PMOS transistor P20. The twentieth PMOS transistor P20 includes a source, which is connected to the first voltage node BIASP, a drain, which is connected to the drain of the second PMOS transistor P2 and the source of the third PMOS transistor P3, and a gate, which is connected to the first power node VDDIO. The base of the third PMOS transistor P3 is thus electrically connected to the first power node VDDIO in the first case and electrically connected to the external connection terminal PAD in the second case.

The first voltage node BIASP has the first voltage VBIASP in the first case where the VSPEC voltage is applied to the first power node VDDIO and in the second case where the first power node VDDIO is in the high impedance state and the external voltage (the VSPEC voltage) equal to or more than the predetermined voltage level is applied to the external connection terminal PAD. Accordingly, in the first case, the twentieth PMOS transistor P20 is turned off, and the output of the fourth control unit 14 goes into the high impedance state. In the second case, the twentieth PMOS transistor P20 is turned on, and the output of the fourth control unit 14 has the first voltage VBIASP. In the first case, the gate of the twentieth PMOS transistor P20 has the VSPEC voltage, the source thereof has the first voltage VBIASP, and the drain thereof has the VSPEC voltage or the first voltage VBIASP. The withstanding voltage of the twentieth PMOS transistor P20 is thus not exceeded. In the second case, the gate of the twentieth PMOS transistor P20 has the ground potential, and the source and the drain thereof have the first voltage VBIASP. The withstanding voltage of the twentieth PMOS transistor P20 is thus not exceeded.

In this way, in this example embodiment, the gate voltages of the respective transistors are controlled by the first control unit 11 to the fourth control unit 14 to not exceed the withstanding voltages of the respective transistors in the I/O cell 3 connected to the pad 4 corresponding to a hot swap event. Therefore, even in a case where a high external voltage is applied to the external connection terminal PAD while the first power node VDDIO is in the power-off state, the withstanding voltages of the respective transistors in the I/O cell 3 will not be exceeded, and the reliability of the I/O cell 3 is consequently improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit, comprising
an output circuit comprising a plurality of switching elements and driven by a power voltage applied across a first power node and a second power node; and
a control circuit driven by the power voltage applied across the first power node and the second power node, the control circuit configured to control the output circuit to output a digital signal at a pad terminal, a logic value of the digital signal being set according to a signal supplied by a core circuit connected to the output circuit,
wherein the digital signal causes a voltage at the first power node to be a high level and causes a voltage at the second power node to be a low level when a predetermined power voltage, which is higher than a withstanding voltage of any one of the plurality of switching elements in the output circuit, is applied across the first power node and the second power node,
wherein the control circuit is configured to control a voltage across terminals of each switching element in the plurality of switching elements to be less than the withstanding voltage of each switching element and to prevent a current flowing from the pad terminal to the output circuit when the first power node is in a high impedance state, and
wherein the control circuit includes:
a voltage dividing circuit configured to divide a voltage applied between a voltage input node and the second power node, and
a switcher configured to either electrically connect the first power node to the voltage input node or electrically connect the pad terminal to the voltage input node.

2. The semiconductor integrated circuit according to claim 1, wherein the switcher is configured to:
electrically connect the first power node to the voltage input node and cut off the electrical connection between the pad terminal and the voltage input node, when the power voltage is applied to the first power node, and
electrically connect the pad terminal to the voltage input node and cut off the electrical connection between the first power node and the voltage input node, when the first power node is in the high impedance state and the digital signal of the power voltage is being applied to the pad terminal.

3. The semiconductor integrated circuit according to claim 1, further comprising:
a pre-driver circuit configured to supply a first signal and a second signal to the output circuit when the power voltage is applied to the first power node.

4. The semiconductor integrated circuit according to claim 3, wherein the output circuit includes:
a first PMOS transistor having a source connected to the first power node and a gate to which the first signal is input,
a second PMOS transistor and a third PMOS transistor that are connected in series between a drain of the first PMOS transistor and the pad terminal,
a first NMOS transistor having a source connected to the second power node and a gate to which the second signal is input, and a second NMOS transistor connected to the first NMOS transistor between the pad terminal and the second power node.

5. The semiconductor integrated circuit according to claim 4, wherein
the drain of the first PMOS transistor and a source of the second PMOS transistor are directly connected, and
a drain of the first NMOS transistor and a source of the second NMOS transistor are directly connected.

6. The semiconductor integrated circuit according to claim 4, wherein
one or more PMOS transistors is connected in series between the drain of the first PMOS transistor and a source of the second PMOS transistor, and
one or more NMOS transistors is connected in series between a drain of the first NMOS transistor and a source of the second NMOS transistor.

7. A semiconductor integrated circuit, comprising:
an input-output cell connected to a first pad terminal and a core circuit, the input-output cell including:
an output circuit configured to supply a digital signal to the first pad terminal, the digital signal having a voltage level corresponding to a voltage value of a signal supplied by the core circuit to the input-output cell; and
a control circuit configured to supply first control signals to the output circuit, wherein
the control circuit comprises a switch element and a voltage dividing circuit connected to the switch element, the switch element being configured to connect a first power terminal to the voltage dividing circuit when a power voltage is being supplied at the first power terminal and to connect the first pad terminal to the voltage dividing circuit when the first power terminal is in a high impedance state, and the voltage dividing circuit being configured to generate the first control signals having voltage levels less than a withstanding voltage of the output circuit according to the power voltage.

8. The semiconductor integrated circuit according to claim 7, further comprising:
a pre-driver circuit connected to the core circuit and the output circuit, the pre-driver circuit configured to receive the signal from the core circuit and output second control signals to the output circuit.

9. The semiconductor integrated circuit according to claim 7, wherein the output circuit comprises:
a first PMOS transistor having a source connected to the first power terminal;
a first NMOS transistor having a source connected to a second power terminal;
a second PMOS transistor having a source connected to a drain of the first PMOS transistor;
a third PMOS transistor having a source connected to a drain of the second PMOS transistor; and
a second NMOS transistor having a source connected to a drain of the first NMOS transistor and a drain of the third PMOS transistor, the drain of the third PMOS transistor and the drain of the second NMOS transistor being connected to the first pad terminal.

10. A semiconductor integrated circuit, comprising:
an input-output cell connected to a first pad terminal and a core circuit, the input-output cell including:
an output circuit configured to supply a digital signal to the first pad terminal, the digital signal having a voltage level corresponding to a voltage value of a signal supplied by the core circuit to the input-output cell; and
a control circuit configured to supply first control signals to the output circuit, voltage levels of the first control signals being set according to a power voltage being applied to the control circuit, the voltage levels of the first control signals being controlled to be less than a withstanding voltage of the output circuit, wherein
the output circuit comprises:
a first PMOS transistor having a source connected to a first power terminal;
a first NMOS transistor having a source connected to a second power terminal;
a second PMOS transistor having a source connected to a drain of the first PMOS transistor;
a third PMOS transistor having a source connected to a drain of the second PMOS transistor; and
a second NMOS transistor having a source connected to a drain of the first NMOS transistor and a drain of the third PMOS transistor, the drain of the third PMOS transistor and the drain of the second NMOS transistor being connected to the first pad terminal, and
the control circuit comprises:
a first control unit configured to connect a base of the second PMOS transistor and a base of the third PMOS transistor to the first power terminal or the first pad terminal;
a second control unit configured to supply a first voltage signal to a gate of the second PMOS transistor and a second voltage signal to a gate of the second NMOS transistor;
a third control unit configured to supply the first voltage signal to a gate of the third PMOS transistor when the power voltage is supplied to the first power terminal and to connect the gate of the third PMOS transistor to the first pad terminal when the first power terminal is in the high impedance state; and
a fourth control unit configured supply the first voltage signal to the drain of the second PMOS transistor and the source of the third PMOS transistor when the first power terminal is in the high impedance state.

11. The semiconductor integrated circuit according to claim 10, further comprising:
a pre-driver circuit connected to the core circuit and the output circuit, the pre-driver circuit configured to receive the signal from the core circuit and output second control signals to the output circuit, wherein
the pre-driver circuit supplies a second control signal at a first voltage level to a gate of the first PMOS transistor a second control signal at a second voltage level to a gate of the first NMOS transistor.

12. A semiconductor integrated circuit, comprising
an output circuit comprising a plurality of switching elements and driven by a power voltage applied across a first power node and a second power node;
a pre-driver circuit configured to supply a first signal and a second signal to the output circuit when the power voltage is applied to the first power node; and
a control circuit driven by the power voltage applied across the first power node and the second power node, the control circuit configured to control the output circuit to output a digital signal at a pad terminal, a logic value of the digital signal being set according to a signal supplied by a core circuit connected to the output circuit, wherein the digital signal causes a voltage at the first power node to be a high level and causes a voltage at the second power node to be a low level when a predetermined power voltage, which is higher than a withstanding voltage of any one of the plurality of switching elements in the output circuit, is applied across the first power node and the second power node, wherein the control circuit is configured to control a voltage across terminals of each switching element in the plurality of switching elements to be less than the withstanding voltage of each switching element and to prevent a current flowing from the pad terminal to the output circuit when the first power node is in a high impedance state, wherein the output circuit includes:
  a first PMOS transistor having a source connected to the first power node and a gate to which the first signal is input,
  a second PMOS transistor and a third PMOS transistor that are connected in series between a drain of the first PMOS transistor and the pad terminal,
  a first NMOS transistor having a source connected to the second power node and a gate to which the second signal is input, and
  a second NMOS transistor connected to the first NMOS transistor between the pad terminal and the second power node, and wherein the control circuit includes:
  a first control unit configured to electrically connect a body region of the second PMOS transistor and a body region of the third PMOS transistor to the first power node when the power voltage is applied to the first power node, and electrically connect the body region of the second PMOS transistor and the body region of the third PMOS transistor to the pad terminal when the first power node is in the high impedance state,
  a second control unit configured to apply a first voltage to a gate of the second PMOS transistor and a second voltage to a gate of the second NMOS transistor when the power voltage is applied to the first power node, and apply the first voltage to the gate and a drain of the second PMOS transistor and the second voltage to the gate of the second NMOS transistor when the first power node is in the high impedance state,
  a third control unit configured to apply the first voltage to a gate of the third PMOS transistor when the power voltage is applied to the first power node, and electrically connect the gate of the third PMOS transistor to the pad terminal when the first power node is in the high impedance state, and
  a fourth control unit configured electrically connect a connection node between the drain of the second PMOS transistor and a source of the third PMOS transistor to the gate of the second PMOS transistor when the first power node is in the high impedance state, and set the connection node to the high impedance state when the first power node is not in the high impedance state.

13. The semiconductor integrated circuit according to claim 12, wherein the first voltage is equal to or more than a voltage at the second power node and equal to or less than the power voltage.

14. The semiconductor integrated circuit according to claim 12, wherein
  the larger of the first voltage and a voltage difference between the power voltage and the first voltage is less than the withstanding voltages of all transistors in the output circuit and the control circuit, and
  the larger of the second voltage and a voltage difference voltage between the power voltage and the second voltage is less than the withstanding voltages of all transistors in the output circuit and the control circuit.

15. The semiconductor integrated circuit according to claim 12, wherein the first control unit includes:
  a fourth PMOS transistor having a source connected to a first voltage node and a gate connected to the first power node,
  a fifth PMOS transistor having a source connected to the first power node, a drain connected to a drain of the fourth PMOS transistor, and a gate connected to the first voltage node,
  a sixth PMOS transistor having a source connected to the pad terminal, and a gate connected to the first voltage node,
  a seventh PMOS transistor having a source connected to a drain of the sixth PMOS transistor, and a gate connected to drains of the fourth PMOS transistor and the fifth PMOS transistor,
  a third NMOS transistor having a drain connected to a drain of the seventh PMOS transistor, a source s connected to the first voltage node, and a gate connected to the gate of the seventh PMOS transistor,
  an eighth PMOS transistor having a source connected to the first voltage node, a drain connected to the source of the seventh PMOS transistor, and a gate connected to the pad terminal,
  a ninth PMOS transistor having a source connected to the first power node, and a gate connected to the first voltage node,
  a tenth PMOS transistor having a source connected to a drain of the ninth PMOS transistor, a drain connected to an output node of the first control unit, and a gate connected to a drain of the seventh PMOS transistor,
  an eleventh PMOS transistor having a source connected to the first voltage node, a drain connected to the source of the tenth PMOS transistor, and a gate connected to the first power node,
  a twelfth PMOS transistor having a source connected to the pad terminal, and a gate connected to the first voltage node,
  a thirteenth PMOS transistor having a source connected to a drain of the twelfth PMOS transistor, a drain connected to the output node of the first control unit, and a gate connected to the drain of the fourth PMOS transistor, and
  a fourteenth PMOS transistor having a source connected to the first voltage node, a drain connected to the source of the thirteenth PMOS transistor, and a gate connected to the pad terminal.

16. The semiconductor integrated circuit according to claim 12, further comprising:
  a fifth control unit configured to output the power voltage when the power voltage is applied to the first power node, and to output the power voltage applied to the pad terminal when the first power node is in the high impedance state, and
  a first potential divider that generates the first voltage from an output of the the fifth control unit, and a second potential divider that generates the second voltage from the output of the fifth control unit.

17. The semiconductor integrated circuit according to claim 12, wherein the third control unit includes:
a fifteenth PMOS transistor having a source connected to a first voltage node, and a gate connected to the first power node,
a sixteenth PMOS transistor having a source connected to the first power node, a drain connected to a drain of the fifteenth PMOS transistor, and a gate connected to the first voltage node,
a seventeenth PMOS transistor having a source connected to the pad terminal, and a gate connected to the first voltage node,
an eighteenth PMOS transistor having a source connected to a drain of the seventeenth PMOS transistor, and a gate connected to the drain of the fifteenth PMOS transistor,
a fourth NMOS transistor having a drain connected to a drain of the eighteenth PMOS transistor and an output node of the third control unit, a source connected to the first voltage node, and a gate connected to the gate of the eighteenth PMOS transistor, and
a nineteenth PMOS transistor having a source connected to the first voltage node, a drain connected to the drain of the seventeenth PMOS transistor, and a gate connected to the pad terminal.

18. The semiconductor integrated circuit according to claim 12, wherein the fourth control unit includes a twentieth PMOS transistor having a source connected to a first voltage node, a drain connected to a drain of the second PMOS transistor and a source of the third PMOS transistor, and a gate connected to the first power node.

* * * * *